(12) United States Patent
Marukawa et al.

(10) Patent No.: US 11,658,550 B2
(45) Date of Patent: May 23, 2023

(54) POWER CONTROL UNIT

(71) Applicant: TOYOTA JIDOSHA KABUSHIKI KAISHA, Toyota (JP)

(72) Inventors: Naoki Marukawa, Numazu (JP); Hiroshi Yaguchi, Susono (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 320 days.

(21) Appl. No.: 17/113,178

(22) Filed: Dec. 7, 2020

(65) Prior Publication Data

US 2021/0257889 A1    Aug. 19, 2021

(30) Foreign Application Priority Data

Feb. 18, 2020   (JP) ............................ JP2020-025323

(51) Int. Cl.
| | |
|---|---|
| *H02K 11/33* | (2016.01) |
| *B60K 1/00* | (2006.01) |
| *B60L 15/20* | (2006.01) |
| *H01L 25/16* | (2023.01) |
| *H02K 7/116* | (2006.01) |

(52) U.S. Cl.
CPC ............... *H02K 11/33* (2016.01); *B60K 1/00* (2013.01); *B60L 15/20* (2013.01); *H01L 25/165* (2013.01); *H02K 7/116* (2013.01)

(58) Field of Classification Search
CPC .......... H02K 11/33; H02K 7/116; H02K 5/10; B60K 1/00; B60K 6/405; B60K 6/26; B60L 15/20; B60L 15/007; H01L 25/165; H01L 25/07; H01L 25/117; H01L 25/16; Y02T 10/64; Y02T 90/16; Y02T 10/72

USPC ....................................................... 310/68 D
See application file for complete search history.

(56) References Cited

U.S. PATENT DOCUMENTS

| | | | |
|---|---|---|---|
| 6,621,701 B2* | 9/2003 | Tamba ............... | H05K 7/20927 165/80.4 |
| 8,072,758 B2* | 12/2011 | Groppo .............. | H05K 7/20927 361/689 |
| 8,848,370 B2* | 9/2014 | Shin ......................... | B60K 6/22 361/698 |

(Continued)

FOREIGN PATENT DOCUMENTS

| | | |
|---|---|---|
| JP | 2010-063234 A | 3/2010 |
| JP | 2011-173480 A | 9/2011 |

(Continued)

*Primary Examiner* — John K Kim
(74) *Attorney, Agent, or Firm* — Oliff PLC (57) ABSTRACT

A PCU case of a power control unit includes a case main body that has an upper surface-side opening and a lower surface-side opening and is formed in a tubular shape with a rectangular cross-section, and an upper cover that covers the upper surface-side opening. The case main body includes a fastening part that is formed so as to surround the lower surface-side opening and fastened to a surface of a transaxle case, and this surface of the transaxle case doubles as a lower surface of the PCU case. The case main body includes a plate-shaped beam member that extends along a short-side direction, connects a pair of long-side side walls to each other, and divides the inside of the case main body into an upper chamber and a lower chamber, and an intermediate opening that provides communication between the upper chamber and the lower chamber.

9 Claims, 8 Drawing Sheets

(56) References Cited

U.S. PATENT DOCUMENTS

| | | | | |
|---|---|---|---|---|
| 9,210,829 B2* | 12/2015 | Hotta | .................... | H02K 11/33 |
| 9,769,962 B2* | 9/2017 | Huang | ............... | H05K 7/20872 |
| 10,027,241 B2* | 7/2018 | Aoki | .................... | H02M 7/003 |
| 11,153,983 B2* | 10/2021 | Marukawa | ............... | H05K 5/03 |
| 2020/0161993 A1* | 5/2020 | Kishimoto | ............... | H02K 9/19 |
| 2021/0257889 A1* | 8/2021 | Marukawa | ............... | B60L 15/20 |

FOREIGN PATENT DOCUMENTS

| | | |
|---|---|---|
| JP | 2012-085416 A | 4/2012 |
| JP | 2016-116340 A | 6/2016 |

\* cited by examiner

POWER CONTROL UNIT

CROSS-REFERENCE TO RELATED APPLICATION

This application claims priority to Japanese Patent Application No. 2020-025323 filed on Feb. 18, 2020, incorporated herein by reference in its entirety.

BACKGROUND

1. Technical Field

The present disclosure relates to a power control unit mounted in an electric vehicle.

2. Description of Related Art

Japanese Patent Application Publication No. 2012-085416 (JP 2012-085416 A), for example, discloses a power control unit (PCU) that is disposed on a surface of a transaxle case of an electric vehicle. The transaxle case houses a motor generator (rotating electrical machine) and gears. A PCU case that houses components of the PCU is composed of an upper lid and a lower lid. The lower lid, i.e., a part constituting a lower surface of the PCU case, is a part (dedicated part) separate from the transaxle case.

SUMMARY

When the part (lower lid) that constitutes the lower surface of the PCU case is separate from the transaxle case as in the structure shown in JP 2012-085416 A, there is actually an airspace between this part and the transaxle case. If there is such an airspace, vibration of the transaxle case originating from the rotating electrical machine or the gears inside the transaxle case may induce Helmholtz resonance in the airspace. It is feared that this may result in increased vibration noise from the PCU case. Therefore, PCU cases are required to have a structure that can avoid an increase in vibration noise due to Helmholtz resonance. The "structure that can avoid an increase in vibration noise" mentioned here is desirably realized while the rigidity of the PCU case is maintained as much as possible and the components of the PCU are allowed to be mounted with good efficiency at the same time.

The present disclosure has been contrived in view of the above problem, and an object thereof is to provide a power control unit including a PCU case that can avoid an increase in vibration noise due to Helmholtz resonance, while maintaining the rigidity of the PCU case as much as possible and allowing the components of the PCU to be mounted with good efficiency at the same time.

A power control unit according to the present disclosure is mounted in an electric vehicle driven by a vehicle driving unit that includes a transaxle case housing at least either a rotating electrical machine or gears.

The power control unit includes a plurality of components that composes the power control unit, and a PCU case that is disposed on a surface of the transaxle case and houses the components.

The PCU case includes:
a case main body having a tubular shape with a rectangular cross-section and including a pair of long-side side walls and a pair of short-side side walls that constitute side surfaces of the PCU case, an upper surface-side opening and a lower surface-side opening that are formed on the sides of an upper surface and a lower surface, respectively, of the PCU case, and a fastening part that is formed so as to surround the lower surface-side opening and fastened to the surface of the transaxle case; and
an upper cover that constitutes the upper surface of the PCU case and covers the upper surface-side opening.

The surface of the transaxle case doubles as the lower surface of the PCU case.

The case main body further includes: a beam member that extends inside the case main body along a short-side direction of the case main body, connects the pair of long-side side walls to each other, and is formed in a plate shape so as to divide the inside of the case main body into an upper chamber and a lower chamber located on the upper surface side and the lower surface side, respectively, of the PCU case; and an intermediate opening that is formed so as to at least partially adjoin the beam member and provides communication between the upper chamber and the lower chamber.

At least one of the components is supported by the beam member. At least two of the components are electrically connected to each other through the intermediate opening while being disposed in the upper chamber and the lower chamber.

When the case main body is seen from the side of the upper cover, a plurality of fastening points provided at each of portions of the fastening part that are located along the pair of long-side side walls may be spaced at irregular intervals.

At least one of the components may be disposed so as to extend to both the upper chamber and the lower chamber across the intermediate opening.

The components that are disposed so as to extend to both the upper chamber and the lower chamber across the intermediate opening may include a power semiconductor module having a plurality of semiconductor switching elements.

The components that are electrically connected to each other through the intermediate opening while being disposed in the upper chamber and the lower chamber may include a combination of a capacitor and a power semiconductor module having a plurality of semiconductor switching elements.

The components that are electrically connected to each other through the intermediate opening while being disposed in the upper chamber and the lower chamber may include a combination of a substrate and a power semiconductor module having a plurality of semiconductor switching elements.

The beam member may be entirely in contact, and integrally formed, with at least one of the pair of short-side side walls.

The beam member may be entirely in contact, and integrally formed, with each of the pair of long-side side walls and the pair of short-side side walls.

The fastening part may be directly fastened to the surface of the transaxle case through a fastener.

In the present disclosure, the PCU case includes the case main body having a tubular shape with a rectangular cross-section that is open on both the upper surface side and the lower surface side of the PCU case, and the upper cover covering the upper surface-side opening of the case main body. The lower surface-side opening of the case main body is closed as the fastening part of the case main body that is formed so as to surround the lower surface-side opening is fastened to the surface of the transaxle case. This means that the PCU case does not include a lower cover that constitutes the lower surface thereof as an independent part, and instead the surface of the transaxle case doubles as the lower surface of the PCU case. Thus, a structure in which there is no airspace between the PCU case and the transaxle case is obtained, so that an increase in vibration noise from the PCU case due to Helmholtz resonance can be avoided.

In the present disclosure, the case main body further includes the beam member that extends inside the case main body along the short-side direction thereof and is formed in a plate shape so as to connect the pair of long-side side walls to each other. It is feared that noise generated from the case main body may increase if the omission of the lower cover causes a decrease in the wall rigidity of the case main body. In this respect, the beam member defines a plane that serves as a beam inside the PCU case in the present disclosure, so that the wall rigidity of the pair of long-side side walls that is longer than the pair of short-side side walls and therefore tends to have relatively low rigidity can be maintained as much as possible.

Moreover, in the present disclosure, at least one of the components is supported by the beam member, and the plate-shaped beam member is formed so as to divide the inside of the case main body into the upper chamber and the lower chamber. Thus, the beam member for improving the wall rigidity can be used to support the components as well as can be used as a partition inside the PCU case, which can contribute to increasing the options in the layout of the components. At least two of the components, while being disposed in the upper chamber and the lower chamber, are electrically connected to each other through the intermediate opening that is formed so as to at least partially adjoin the beam member. This structure makes it possible to include the beam member for improving the wall rigidity and at the same time easily establish the function of electrically connecting components disposed in the upper chamber and the lower chamber to each other. Thus, this structure can ensure good efficiency in mounting the components of the PCU.

As has been described above, the present disclosure can provide a power control unit including a PCU case that can avoid an increase in vibration noise due to Helmholtz resonance, while maintaining the rigidity of the PCU case as much as possible and allowing the components of the PCU to be mounted with good efficiency at the same time.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

In embodiments to be described below, the same components in the drawings will be denoted by the same reference signs and an overlapping description thereof will be omitted or simplified. If a numerical value, such as a number, quantity, amount, or range, of a component is mentioned in the embodiments shown below, it is not intended to limit the present disclosure to the numerical value mentioned, except when that value is specifically indicated or when the component is in principle obviously specified to be of that value. Constituent elements of the present disclosure including structures to be described in the embodiments shown below are not necessarily essential to the disclosure, except when that element is clearly indicated or when the disclosure is in principle obviously specified to have that element.

1. Embodiment 1

Embodiment 1 of the present disclosure will be described with reference to FIG. 1 to FIG. 7C.

1-1. Example of Structure Around PCU Case

Figure 1:
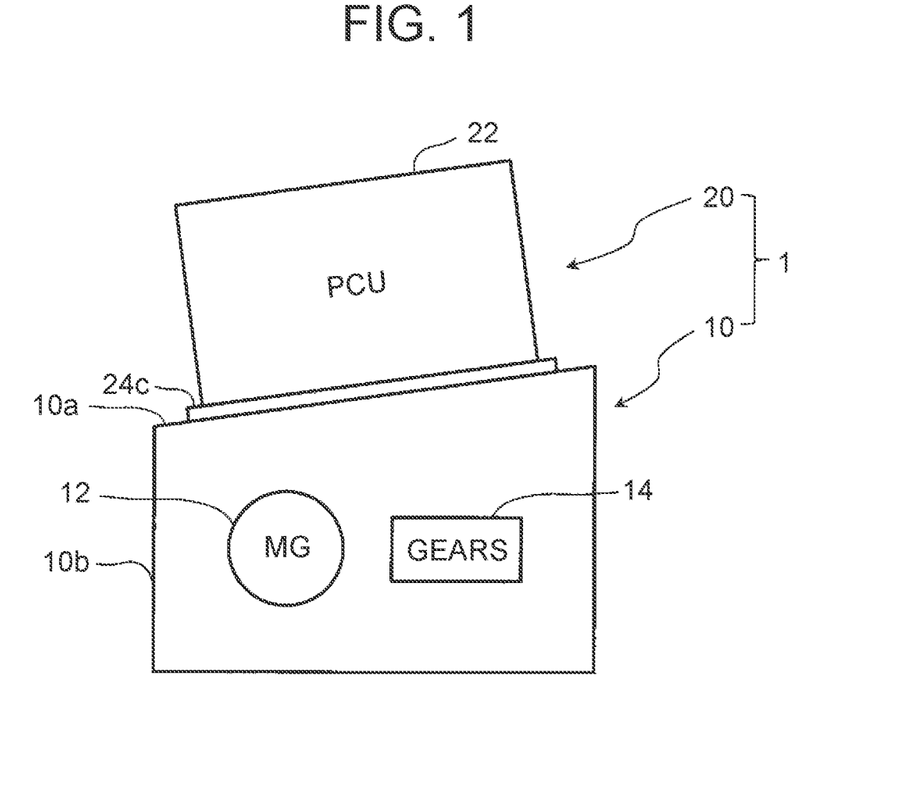
FIG. 1 is a view schematically showing one example of the mounting structure of a power control unit according to Embodiment 1 of the present disclosure.

FIG. 1 is a view schematically showing one example of the mounting structure of a power control unit 20 according to Embodiment 1. The configuration shown in FIG. 1 includes a vehicle driving unit 1 that drives an electric vehicle. The vehicle driving unit 1 includes, for example, a transaxle case (TA case) 10 that houses both a rotating electrical machine and gears. The TA case 10 is made of metal, such as aluminum.

The "rotating electrical machine" refers to a machine that has the function of at least either an electric motor or a power generator. In the example of the TA case 10, a motor generator 12 that has the functions of both an electric motor and a power generator is provided as the rotating electrical machine used to drive the electric vehicle. The motor generator 12 is used mainly as an electric motor that drives the electric vehicle. Alternatively, the rotating electrical machine housed in the TA case 10 may be configured to function only as an electric motor or a power generator.

In the example of the TA case 10, gears 14 that transmit power to wheels (not shown) include a transmission that is combined with an internal combustion engine (not shown), and a differential gear. Power from the motor generator 12 and power from the internal combustion engine are transmitted to the wheels through the differential gear. Thus, the electric vehicle in this example is a hybrid vehicle. Instead of such a hybrid vehicle, the "electric vehicle" according to the present disclosure may be, for example, a battery electric vehicle that does not include an internal combustion engine. Further, instead of the example shown in FIG. 1, the "transaxle case" according to the present disclosure may be a case that houses only either the "rotating electrical machine" or the "gears."

The vehicle driving unit 1 further includes a power control unit (PCU) 20. The PCU 20 is a power converter for controlling the motor generator 12. The PCU 20 is disposed on an upper surface 10a of the TA case 10. As shown in FIG. 1, the vehicle driving unit 1 has an integrated electromechanical structure in which a PCU case 22 that is a case of the PCU 20 is directly fastened to the TA case 10 with fasteners such as bolts 72 (see FIG. 7A to be described later). The place in which the "PCU case (power control unit case)" according to the present disclosure is disposed is not limited to the upper surface of the transaxle case as long as the place is a "surface" thereof, and for example, may also be a side surface 10b of the TA case 10.

Figure 2:
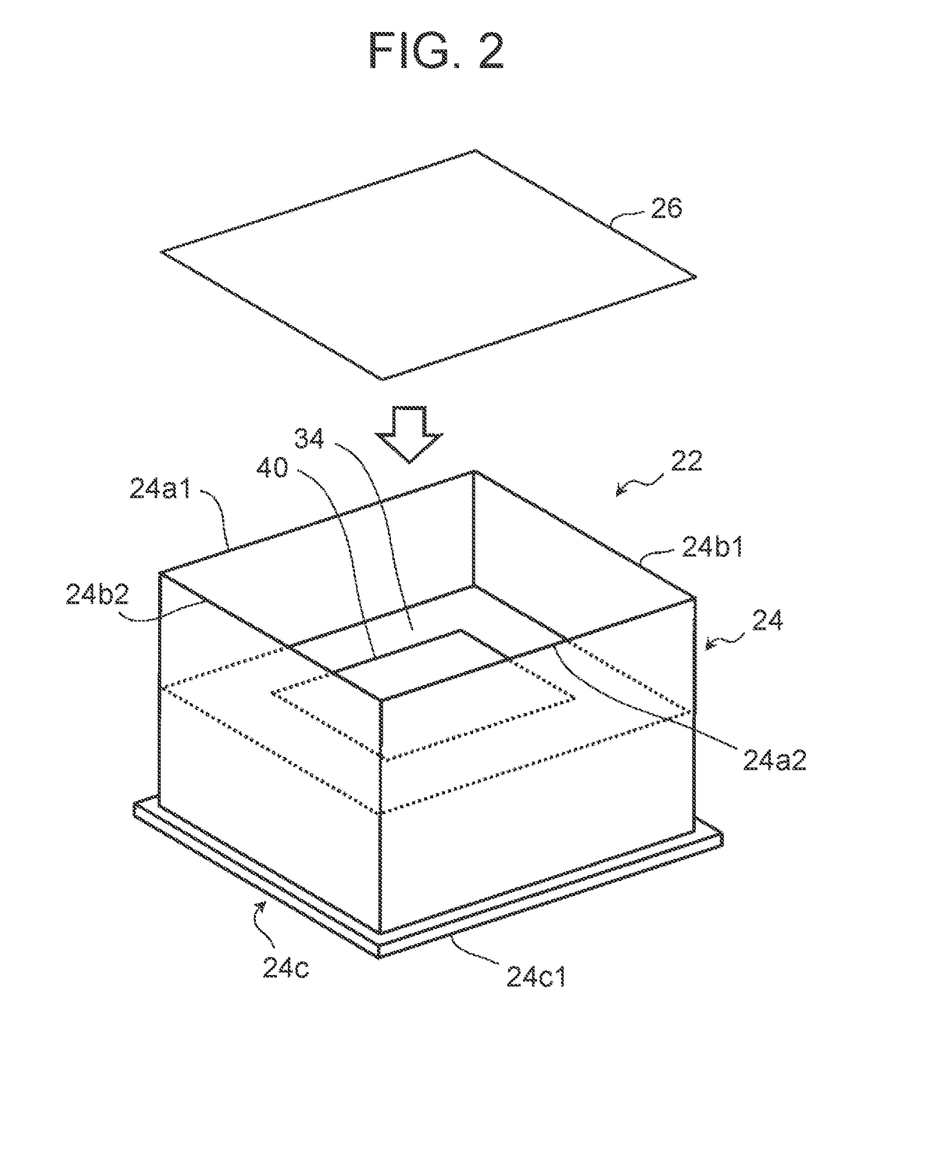
FIG. 2 is a view schematically showing the structure of the PCU case shown in FIG. 1.
Figure 3:
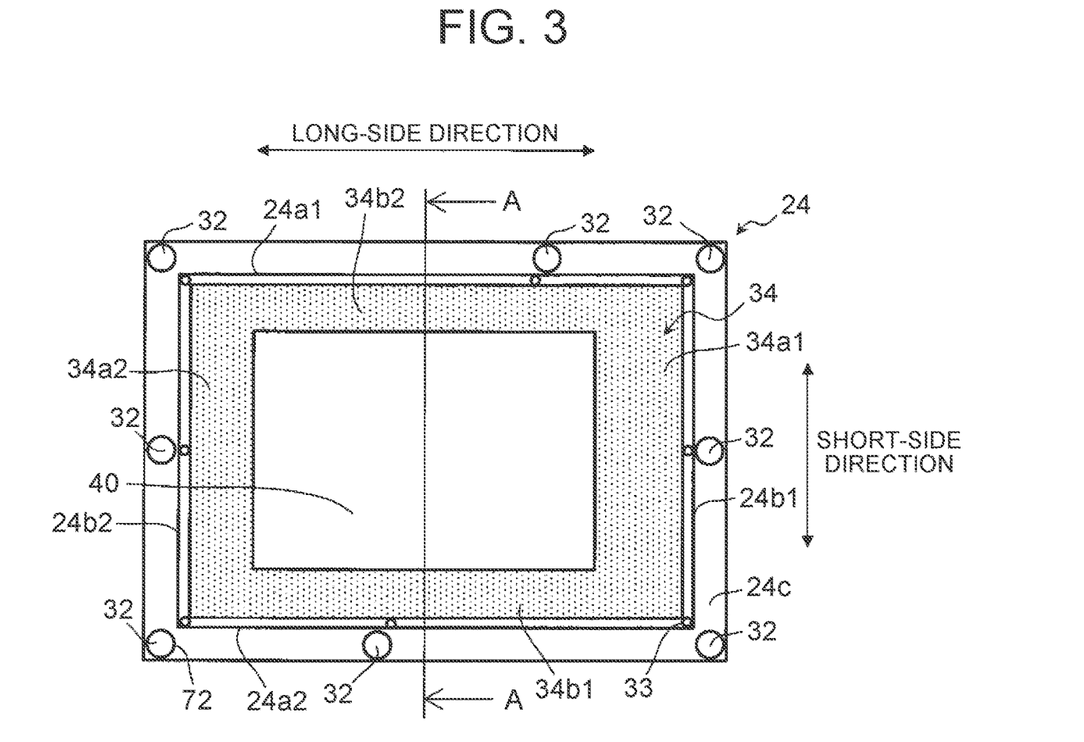
FIG. 3 is a view schematically showing the structure of the PCU case shown in FIG. 1.
Figure 4:
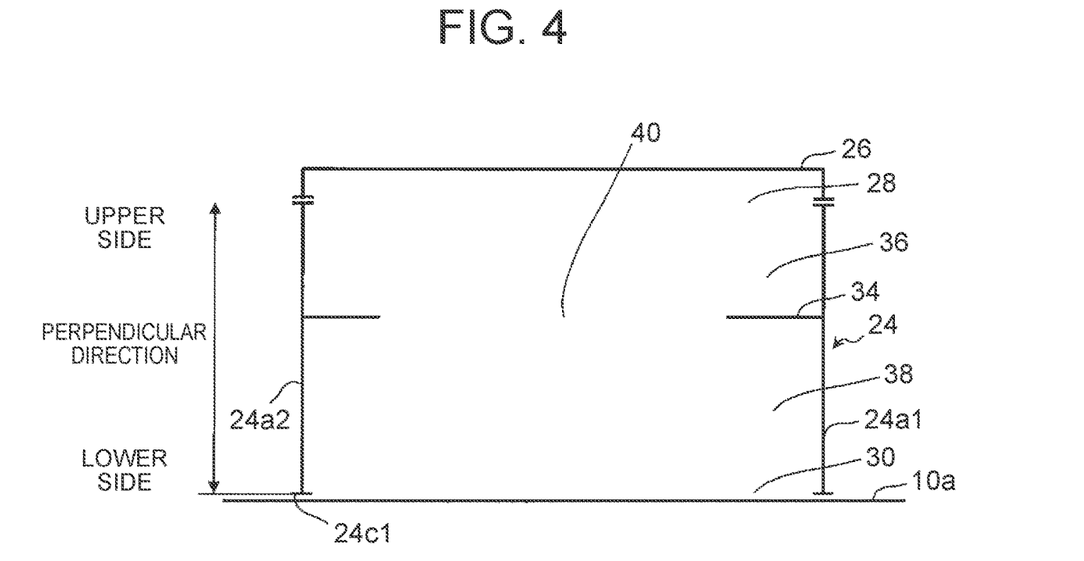
FIG. 4 is a view schematically showing the structure of the PCU case shown in FIG. 1.
Figure 5A:
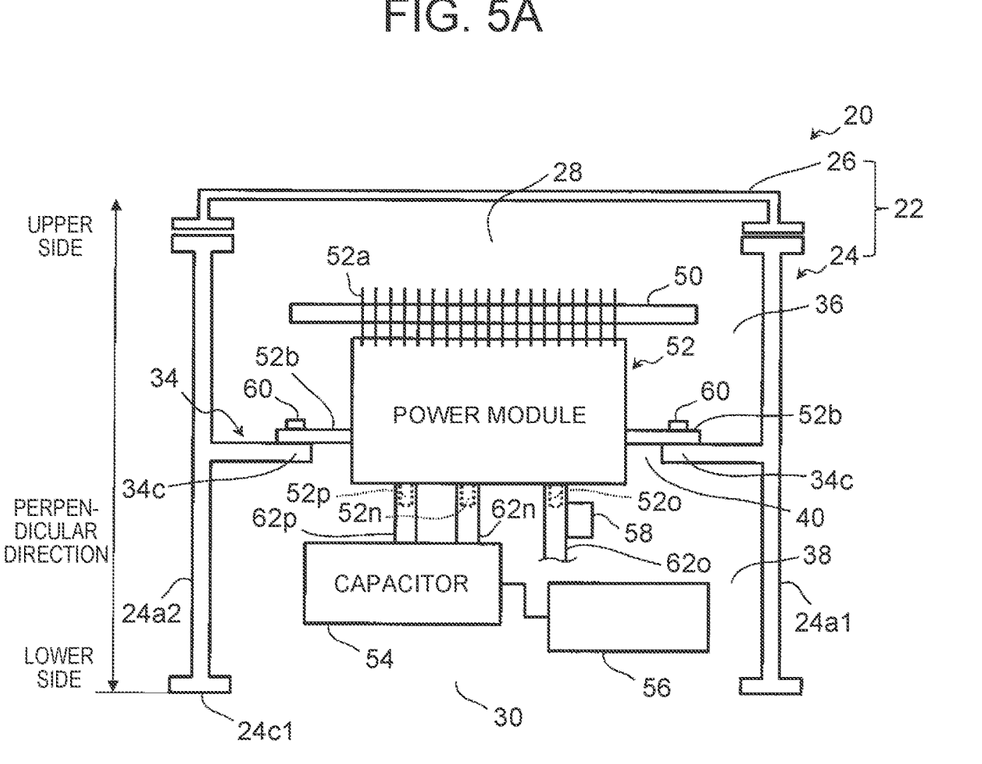
FIG. 5A and FIG. 5B are schematic views showing one example of the layout structure of components of the PCU shown in FIG. 1.
Figure 5B:
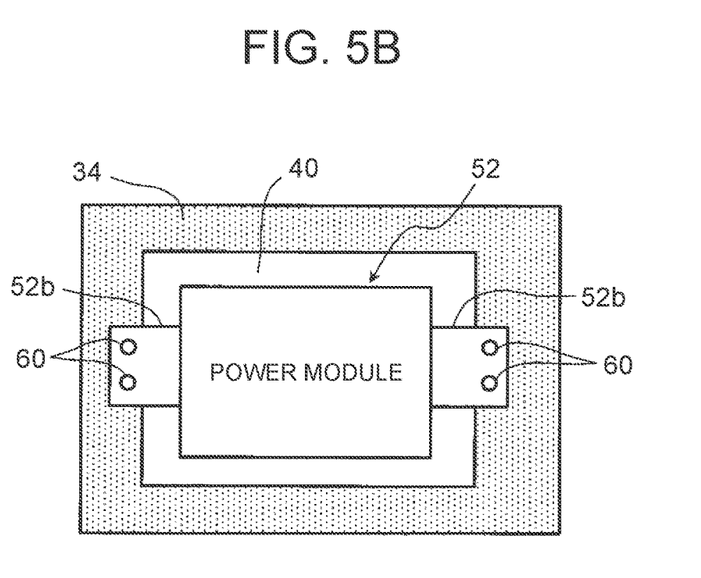

FIG. 2 to FIG. 4 are views schematically showing the structure of the PCU case 22 shown in FIG. 1. More specifically, FIG. 2 is a perspective view of the PCU case 22. FIG. 3 is a view of a case main body 24 as seen from the side of an upper cover 26. FIG. 4 is a view of section A-A in FIG. 3. As illustrated in FIG. 5A and FIG. 5B for reference, the PCU case 22 houses a plurality of components that composes the PCU 20. However, these components are not shown in FIG. 2 to FIG. 4.

The PCU case 22 is composed of the case main body 24 and the upper cover 26. In this specification, for the structure around the PCU case 22, a side closer to the upper cover 26 and a side closer to a fastening surface of the case main body that is fastened to the surface of the transaxle case (in FIG. 4, a fastening surface 24c1), in a direction perpendicular to the fastening surface 24c1, are referred to as an "upper side" and a "lower side," respectively.

The case main body 24 includes a pair of long-side side walls 24a1, 24a2 and a pair of short-side side walls 24b1, 24b2 constituting four side surfaces of the PCU case 22 that has a rectangular parallelepiped shape or a substantially rectangular parallelepiped shape. The case main body 24 is formed in a tubular shape with a rectangular cross-section and has openings at both ends. The openings mentioned here refer to an upper surface-side opening 28 and a lower surface-side opening 30 that are formed on the sides of an upper surface and a lower surface, respectively, of the PCU case 22.

The upper cover 26 constitutes the upper surface of the PCU case 22. The upper cover 26 is fastened to the case main body 24 so as to cover the upper surface-side opening 28. The case main body 24 includes a fastening part 24c that is fastened to the upper surface 10a of the TA case 10. The fastening part 24c is formed in a flange shape so as to surround the lower surface-side opening 30. The fastening part 24c has the fastening surface 24c1 that faces the upper surface 10a of the TA case 10.

As shown in FIG. 3, the fastening part 24c of the case main body 24 has a plurality of (e.g., eight) fastening points 32. At each fastening point 32, the fastening part 24c (case main body 24) is directly fastened to the upper surface 10a of the TA case 10 through the bolt 72 (e.g., see FIG. 7A to be described later) that is one example of fasteners. As a result, the lower surface-side opening 30 of the case main body 24 is covered by the upper surface 10a of the TA case 10. This means that the upper surface 10a of the TA case 10 doubles as the lower surface of the PCU case 22. In the PCU 20 of this embodiment having such a structure, the lower surface-side opening 30 is covered by the upper surface 10a of the TA case 10.

More specifically, in the top view shown in FIG. 3 (i.e., when the case main body 24 is seen from the side of the upper cover 26), the plurality of (in FIG. 3, three) fastening points 32 provided at each of portions of the fastening part 24c that are located along the pair of long-side side walls 24a1, 24a2 (along a long-side direction of the case main body 24) are spaced at irregular intervals. In other words, on the side of each of the pair of long-side side walls 24a1, 24a2, no two pitches between the fastening points 32 located along the long-side direction are equal.

FIG. 3 also shows a plurality of (e.g., eight) fastening holes 33 of the case main body 24 at which the upper cover 26 is fastened through fasteners (not shown). As shown in FIG. 3, also those of the fastening points of the case main body 24 for fastening the upper cover 26 that are located along the long-side direction of the case main body 24 are, for example, spaced at irregular intervals.

As shown in FIG. 2 to FIG. 4, the case main body 24 further includes a beam member 34 that is disposed inside the case main body 24. To enhance the rigidity of the case main body 24, the beam member 34 is formed so as to extend along the short-side direction of the case main body 24 and connect to each other the pair of long-side side walls 24a1, 24a2 that face each other. The beam member 34 is formed in a plate shape so as to divide the inside of the case main body 24 into an upper chamber 36 and a lower chamber 38 that are located on the upper surface side and the lower surface side, respectively, of the PCU case 22.

More specifically, in the example shown in FIG. 2 to FIG. 4, the beam member 34 is entirely in contact (i.e., the entire perimeter of the beam member 34 is in contact), and integrally formed, with each of the pair of long-side side walls 24a1, 24a2 and the pair of short-side side walls 24b1, 24b2. Thus, the beam member 34 includes, at ends in the long-side direction, beam parts 34a1, 34a2 that extend in the short-side direction and connect the pair of long-side side walls 24a1, 24a2 to each other, and also includes coupling parts (second beam parts) 34b1, 34b2 that extend along the long-side direction and connect the beam parts 34a1, 34a2 to each other.

The case main body 24 further includes an intermediate opening 40 (pass-through) that provides communication between the upper chamber 36 and the lower chamber 38. For example, the intermediate opening 40 is formed such that the entire perimeter thereof adjoins the beam member 34. Thus, as shown in FIG. 3, the intermediate opening 40 is equivalent to a through-hole that is formed at the center of the plate-shaped beam member 34. For example, the intermediate opening 40 has a rectangular shape as shown in FIG. 3. The beam member 34 need not necessarily be entirely in contact, and integrally formed, with each of the long-side side walls 24a1, 24a2 and the short-side side walls 24b1, 24b2. For example, the beam member 34 may be partially in contact with at least one of the side wall 24a1 and the other side walls and may be integrally formed with the at least one side wall.

FIG. 5A and FIG. 5B are schematic views showing one example of the layout structure of the components of the PCU 20 shown in FIG. 1. More specifically, FIG. 5A corresponds to a view of section A-A in FIG. 3, and FIG. 5B is a view of the case main body 24 as seen from the side of the upper cover 26 as with FIG. 3. In FIG. 5B, a substrate 50 is not shown.

The PCU case 22 houses the components that compose the PCU 20. Here, as these components, the substrate 50 and electronic components (e.g., a power semiconductor module 52, a capacitor 54, a reactor 56, and a current sensor 58) are illustrated.

The power semiconductor module (hereinafter also referred to simply as a "power module") 52 is formed, for example, as a flat plate-shaped power card in which a plurality of semiconductor switching elements (not shown) for power control is covered with a resin mold. Typically, the power module 52 is housed in the PCU case 22 in the form of a power module unit produced by stacking a plurality of power modules 52. However, to simplify the description, only one power module 52 will be described as an example here. The capacitor 54 smooths a voltage supplied from a battery (not shown).

In the example shown in FIG. 5A, the substrate 50 is disposed in the upper chamber 36. For example, the substrate 50 is mounted inside the upper chamber 36, on the pair of short-side side walls 24b1, 24b2. The power module 52 is disposed under the substrate 50. The power module 52 is disposed in such a direction that signal lines 52a of the respective semiconductor elements incorporated in the power module 52 extend toward the substrate 50. The signal lines 52a are soldered to the substrate 50. A positive-electrode power terminal 52p, a negative-electrode power terminal 52n, and an alternating-current power terminal 52o are provided on a side of the power module 52 opposite from the signal lines 52a.

In the example shown in FIG. 5A, a large part of the power module 52 is located in the upper chamber 36, while a part thereof where the power terminals 52p, 52n, 52o, etc. are provided extends to the lower chamber 38 across the intermediate opening 40. Thus, in this example, the intermediate opening 40 is large enough for the power module 52 (power module unit) that is a component (to be exact, an electronic component) of the PCU 20 to pass through.

The power module 52 is supported by the beam member 34. More specifically, the power module 52 includes a pair of support parts 52b. The pair of support parts 52b is disposed on the side of the upper chamber 36 and fastened to support parts 34c of the beam member 34 through bolts 60 that are one example of fasteners. Instead of this example, the pair of support parts 52b may be supported by the beam member 34 on the side of the lower chamber 38.

The positive-electrode power terminal 52p and the negative-electrode power terminal 52n of the power module 52 are connected to the capacitor 54 through a positive-electrode bus bar (P-bus bar) 62p and a negative-electrode bus bar (N-bus bar) 62n, respectively. In the example shown in FIG. 5A, the capacitor 54 is disposed in the lower chamber 38. Thus, the power module 52 of which a large part is located in the upper chamber 36 is electrically connected to the capacitor 54 located in the lower chamber 38 through the intermediate opening 40.

In the example shown in FIG. 5A, the reactor 56 is disposed in the lower chamber 38. The alternating-current power terminal 52o of the power module 52 is connected to the motor generator 12 outside the PCU case 22 through an alternating-current bus bar (also called an output bus bar) 62o. The current sensor 58 is mounted, for example, inside the lower chamber 38, on the alternating-current bus bar 62o. The capacitor 54 and the reactor 56 are mounted on a wall of the case main body 24.

Figure 6A:
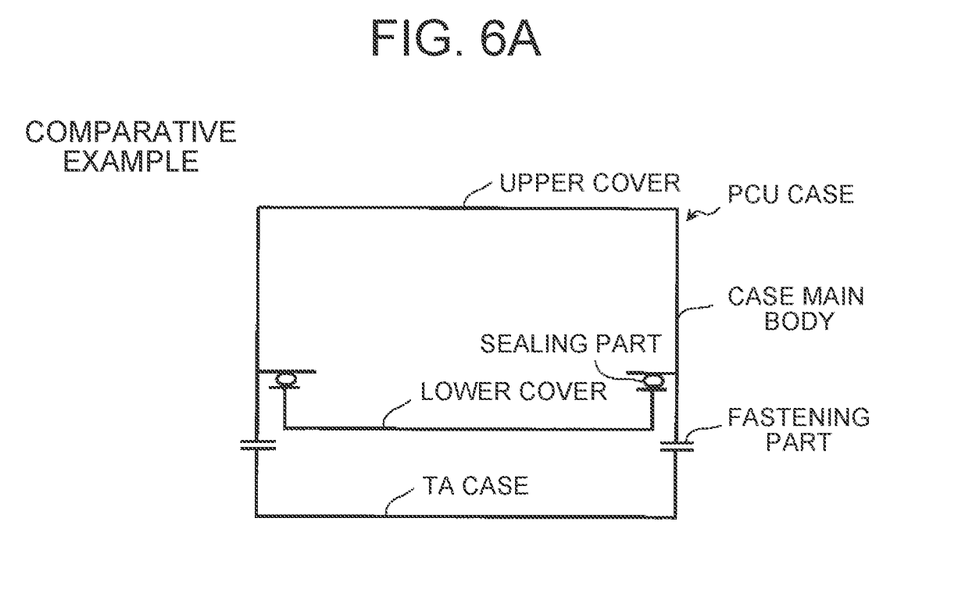
FIG. 6A is a schematic view showing a sealing structure in a comparative example.
Figure 6B:
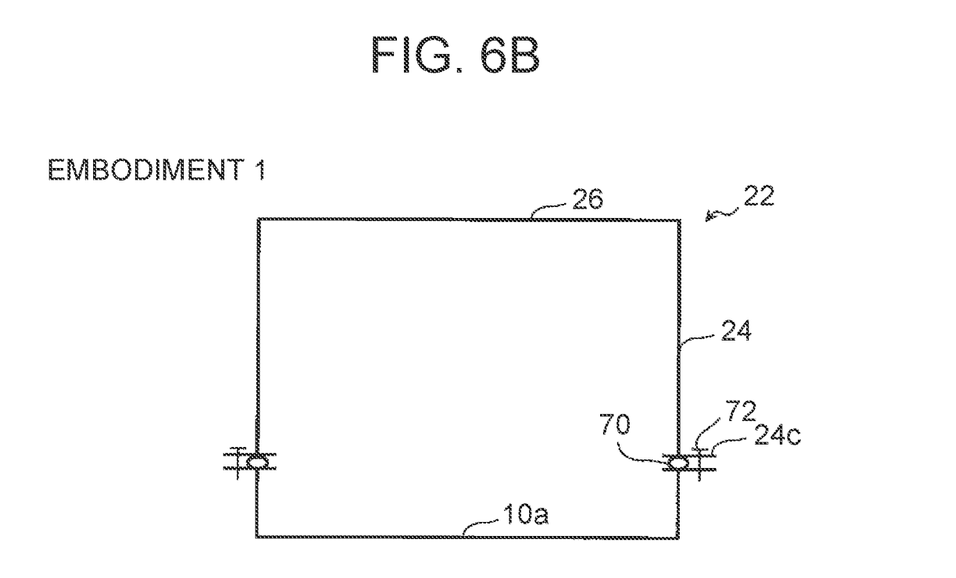
FIG. 6B is a schematic view showing a sealing structure according to Embodiment 1.

FIG. 6A is a schematic view showing a sealing structure in a comparative example, and FIG. 6B is a schematic view showing a sealing structure according to Embodiment 1. Disposing a PCU case on a surface of a transaxle case like the PCU case 22 of this embodiment requires a sealing part that prevents foreign objects, such as water, from entering the PCU case through the fastening part between the PCU case and the transaxle case.

In the comparative example shown in FIG. 6A, a sealing part is provided inside the PCU case, separately from a fastening part between the PCU case and the transaxle case. In the comparative example in which the fastening part and the sealing part are thus different parts, a cover that covers the lower surface of the PCU case is required to realize a sealing structure.

By contrast, in the sealing structure of this embodiment shown in FIG. 6B, a sealing part 70 is provided on the same surface as the fastening part 24c of the case main body 24. This makes it possible to include a rational sealing structure while adopting the structure in which the upper surface 10a of the TA case 10 doubles as the lower surface of the PCU case 22.

Figure 7A:
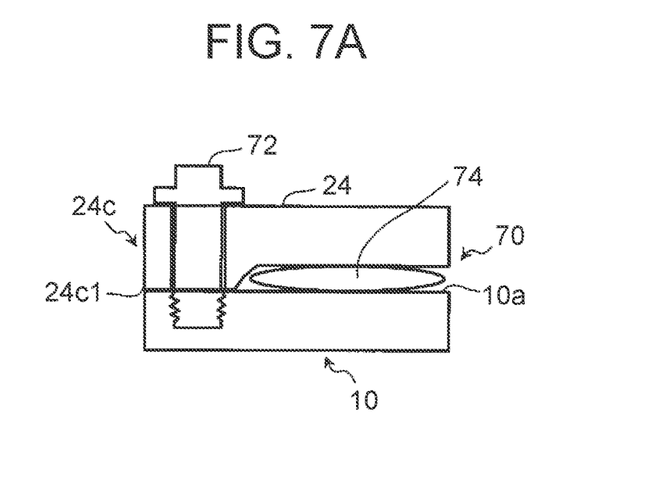
FIG. 7A to FIG. 7C are schematic views showing examples of the structure around a fastening part of the case main body shown in FIG. 4.
Figure 7B:
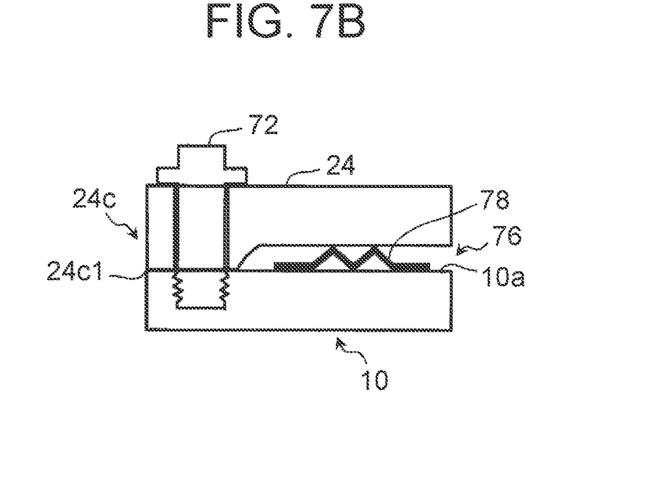
Figure 7C:
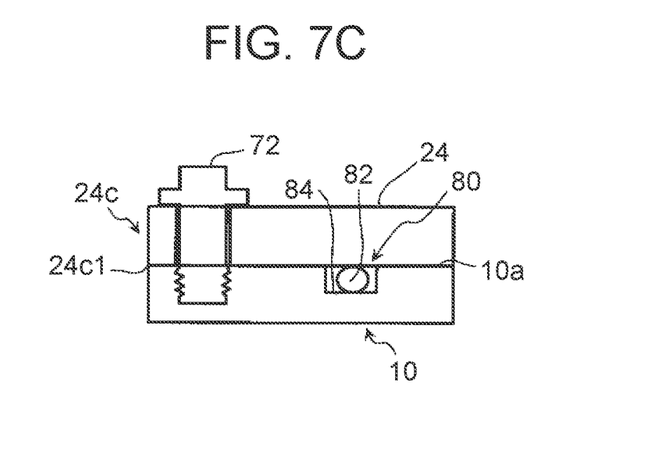

FIG. 7A to FIG. 7C are schematic views showing examples of the structure around the fastening part 24c of the case main body 24 shown in FIG. 4 as well as examples of the sealing structure. In FIG. 7A and FIG. 7B, to illustrate gaskets, the clearance between the case main body 24 and the TA case 10 is depicted larger than it actually is.

Before the examples of the sealing structure are described, here is a supplementary description of the structure of the fastening part 24c. As shown in FIG. 7A, the fastening part 24c is directly fastened to the upper surface 10a of the TA case 10 through the bolt 72 (fastener). Specifically, the fastening surface 24c1 of the fastening part 24c is rigidly fastened to the upper surface 10a facing the fastening surface 24c1, without a vibration damping member, such as rubber, interposed therebetween.

Next, the examples of the sealing structure will be described. First, in the example shown in FIG. 7A, the sealing part 70 is disposed on an inner side of the case main body 24 relative to the fastening part 24c so as to surround the lower surface-side opening 30. At the sealing part 70, a liquid gasket (formed-in-place gasket (FIPG)) 74 is interposed between the case main body 24 and the TA case 10. In the example of a sealing part 76 shown in FIG. 7B, a metal gasket 78 is interposed between the case main body 24 and the TA case 10. In the example of a sealing part 80 shown in FIG. 7C, a rubber gasket is used. Specifically, a groove 84 that houses an O-ring 82 is formed on the side of the TA case 10. At the sealing part 80, the gap between the case main body 24 and the TA case 10 is sealed with the O-ring 82. Alternatively, the groove 84 may be formed on the side of the case main body 24.

1-2. Advantages

The motor generator 12 and the gears 14 inside the TA case 10 vibrate when the vehicle is driven and their vibration is propagated to the TA case 10, causing noise as motor noise and gear noise. It is conceivable to dispose, on a surface of a TA case, a PCU including a PCU case that, unlike the PCU case of this embodiment, includes a lower cover to cover the lower surface of the PCU and is closed independently of the TA case. If such a configuration is adopted, an airspace (to be exact, an airspace communicating with the outside through an opening) is left between the PCU case and the TA case, and Helmholtz resonance may occur in the airspace in a specific frequency band. It is feared that this may result in increased vibration noise from the PCU case.

In view of this problem, the PCU case 22 of this embodiment includes the case main body 24 having a tubular shape with a rectangular cross-section that is open at both ends, and the upper cover 26 covering the upper surface-side opening 28 of the case main body 24. The lower surface-side opening 30 of the case main body 24 is closed as the fastening part 24c of the case main body 24 formed so as to surround the lower surface-side opening 30 is fastened to the upper surface 10a of the TA case 10. This means that the PCU case 22 does not include a lower cover that constitutes the lower surface thereof as an independent part, and instead the upper surface 10a of the TA case 10 doubles as the lower surface of the PCU case 22. Thus, a structure in which there is no airspace between the PCU case 22 and the TA case 10 is obtained, so that an increase in vibration noise of the PCU case 22 due to Helmholtz resonance can be avoided.

On this basis, as shown in FIG. 3, the case main body 24 further includes the beam member 34 that extends inside the case main body 24 along the short-side direction thereof and is formed in a plate shape so as to connect the pair of long-side side walls 24a1, 24a2 to each other. It is feared that noise generated from the case main body may increase if the omission of the lower cover causes a decrease in the wall rigidity of the case main body. In this respect, the beam member 34 defines a plane that serves as a beam inside the PCU case 22 in this embodiment, so that the wall rigidity of the pair of long-side side walls 24a1, 24a2 that is longer than the pair of short-side side walls 24b1, 24b2 and therefore tends to have relatively low rigidity can be maintained as much as possible.

Moreover, in this embodiment, the power module 52 that is one example of the components of the PCU 20 is supported by the beam member 34, and the plate-shaped beam member 34 is formed so as to divide the inside of the case main body 24 into the upper chamber 36 and the lower chamber 38. Thus, the beam member 34 for improving the wall rigidity can be used to support a component (e.g., the power module 52) as well as can be used as a partition inside the PCU case 22, which can contribute to increasing the layout flexibility of the components. Two (e.g., the power module 52 and the capacitor 54) as a combination of the components of the PCU 20 are electrically connected to each other through the intermediate opening 40 while being disposed in the upper chamber 36 and the lower chamber 38. This structure makes it possible to include the beam member 34 for improving the wall rigidity and at the same time easily establish the function of electrically connecting components disposed in the upper chamber 36 and the lower chamber 38 to each other by using the intermediate opening 40 located near the beam member 34. Specifically, if a beam member without the intermediate opening 40 divides the inside into the upper chamber 36 and the lower chamber 38, it is necessary to connect a component disposed in the upper chamber 36 and a component disposed in the lower chamber 38 to each other by means of a conductive member, such as a bus bar or a cable, that is disposed outside the PCU case 22. This need can be eliminated by using the intermediate opening 40. Thus, this structure can ensure good efficiency in mounting the components of the PCU 20.

As has been described above, this embodiment can provide the PCU 20 including the PCU case 22 that can avoid an increase in vibration noise due to Helmholtz resonance, while maintaining the rigidity of the PCU case 22 (case main body 24) as much as possible and allowing the components of the PCU 20 to be mounted with good efficiency at the same time.

As shown in FIG. 3, in this embodiment, when the case main body 24 is seen from the side of the upper cover 26, the fastening points 32 provided at each of the portions of the fastening part 24c that are located along the pair of long-side side walls 24a1, 24a2 (i.e., along the long-side direction) are spaced at irregular intervals. In the "power control unit (PCU)" that is the subject of the present disclosure, the fastening points need not necessarily be spaced at irregular intervals and may also be spaced at regular intervals. However, spacing the fastening points 32 at irregular intervals can further enhance the vibration reducing effect on the PCU case 22 for the following reason: When walls are assumed to have the same thickness, the rigidity of the walls is determined mainly by intervals (pitches) between fastening points. If the fastening points are spaced at equal intervals, the portions between adjacent fastening points included in a pair of long-side side walls resonate with vibration from the TA case in similar frequency bands. This may result in increased noise from the PCU case. By contrast, when the fastening points 32 located along the long-side direction of the case main body 24 are provided at irregular intervals, the resonance frequency bands of the portions between adjacent fastening points 32 can be prevented from overlapping each other. Thus, the reducing effect on vibration noise from the PCU case 22 (case main body 24) can be further enhanced.

In this embodiment, as shown in FIG. 5A, the power module 52 that is one example of the components of the PCU 20 is disposed so as to extend to both the upper chamber 36 and the lower chamber 38 across the intermediate opening 40. When such a configuration cannot be adopted, the entire power module 52 need be disposed in the upper chamber 36 or the lower chamber 38. This leads to an increase in the volume of the upper chamber 36 or the lower chamber 38, and further to an increase in the height of the PCU case 22 (case main body 24) relative to the fastening surface 24c1. By contrast, this embodiment can avoid an increase in vibration noise due to Helmholtz resonance while keeping the height of the PCU case 22 down (i.e., while reducing the size of the PCU case 22).

The beam member 34 of this embodiment not only connects the pair of long-side side walls 24a1, 24a2 to each other but also is entirely in contact, and integrally formed, with both of the pair of short-side side walls 24b1, 24b2. This makes it possible to avoid an increase in vibration noise due to Helmholtz resonance while further enhancing the rigidity of the PCU case 22 (case main body 24). Furthermore, the beam member 34 is entirely in contact, and integrally formed, with each of the pair of long-side side walls 24a1, 24a2 and the pair of short-side side walls 24b1, 24b2. This makes it possible to avoid an increase in vibration noise due to Helmholtz resonance while more effectively enhancing the rigidity of the PCU case 22 (case main body 24).

In addition, in this embodiment, the fastening part 24c of the case main body 24 is directly (rigidly) fastened to the upper surface 10a of the TA case 10 through the bolts 72 (fasteners). However, the "fastening part" according to the present disclosure need not necessarily be directly fastened to the surface of the transaxle case, and may also be fastened to the surface, for example, through a vibration damping member, such as rubber. On this basis, this embodiment adopts the structure in which the case main body 24 including the beam member 34 is directly fastened to the upper surface 10a of the TA case 10. It is therefore possible to configure the PCU 20 so as to avoid an increase in vibration noise due to Helmholtz resonance while reducing the cost by omitting a vibration damping member and securing the wall rigidity of the case main body 24 at the same time.

2. Embodiment 2

Next, Embodiment 2 of the present disclosure will be described with reference to FIG. 8.

Figure 8:
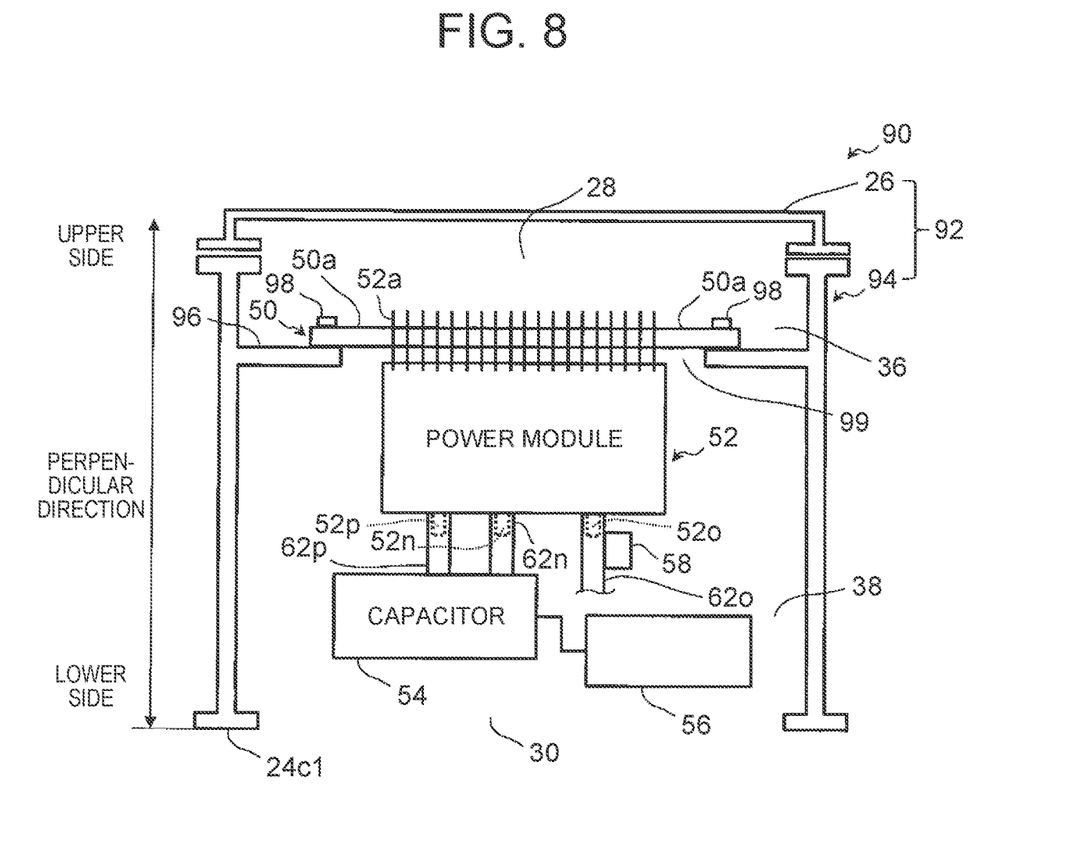
FIG. 8 is a schematic view showing one example of the layout structure of components of a PCU according to Embodiment 2 of the present disclosure.

FIG. 8 is a schematic view showing one example of the layout structure of components of a PCU 90 according to Embodiment 2. The configuration of the PCU 90 of this embodiment is the same as that of the PCU 20 of Embodiment 1 except in the following respects. Specifically, FIG. 8 corresponds to a view of a section obtained by cutting a PCU case 92 of the PCU 90 at the same position as line A-A in FIG. 3.

As shown in FIG. 8, the PCU case 92 includes a case main body 94 along with the upper cover 26. The case main body 94 includes a beam member 96. The beam member 96 is different from the beam member 34 in the position in the direction perpendicular to the fastening surface 24c 1 (up-down direction). Specifically, the beam member 96 is provided at a position closer to the upper cover 26 than the beam member 34 is. In the example of the PCU case 92, the substrate 50, instead of the power module 52, is supported by the beam member 96. More specifically, the substrate 50 includes a pair of support parts 50a. The pair of support parts 50a is fastened to the beam member 96 through bolts 98 that are one example of fasteners. In this example, the power module 52 is mounted on a wall of the case main body 94 inside the lower chamber 38.

In addition, in the example shown in FIG. 8, the power module 52 and other electronic components (e.g., the capacitor 54, the reactor 56, and the current sensor 58) are disposed in the lower chamber 38. In this example, therefore, the substrate 50 and the power module 52 are electrically connected to each other through an intermediate opening 99 while being disposed in the upper chamber 36 and the lower chamber 38.

Embodiment 2 having been described above can also provide the PCU 90 including the PCU case 92 that can avoid an increase in vibration noise due to Helmholtz resonance, while maintaining the rigidity of the PCU case 92 (case main body 94) as much as possible and allowing the components of the PCU 90 to be mounted with good efficiency.

3. Other Embodiments

Other Examples of Form of Beam Member

Figure 9A:
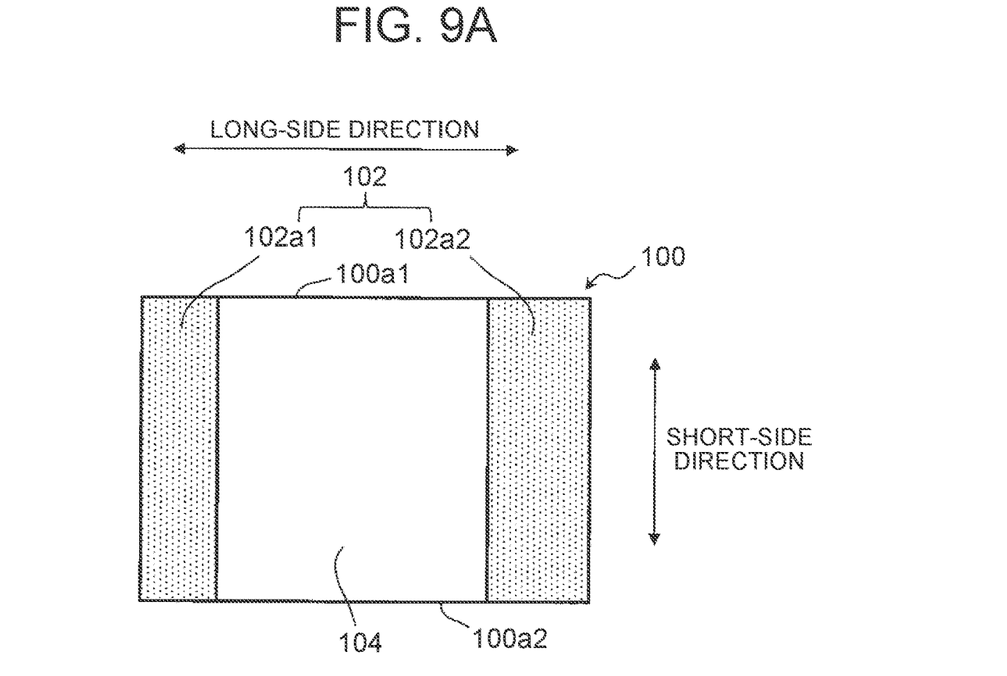
FIG. 9A and FIG. 9B are views showing other examples of the form of a beam member according to the present disclosure.
Figure 9B:
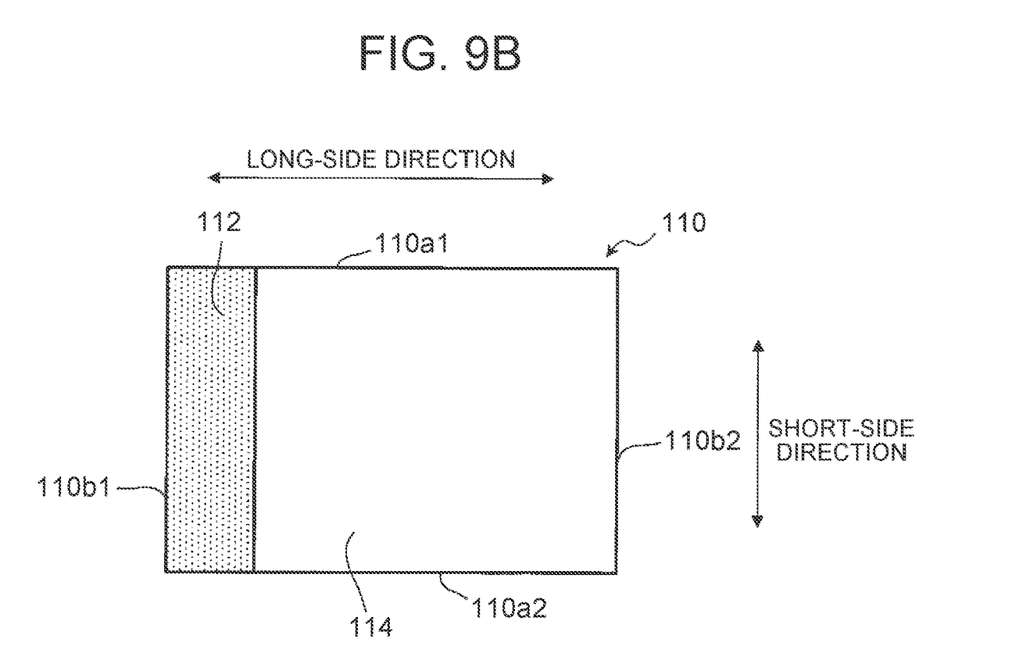

FIG. 9A and FIG. 9B each show another example of the form of the beam member according to the present disclosure. More specifically, FIG. 9A and FIG. 9B are views of case main bodies 100, 110, respectively, as seen from the side of the upper cover 26 as with FIG. 3.

The case main body 100 shown in FIG. 9A includes a beam member 102. Like the beam member 34 (see FIG. 3), the beam member 102 includes, at ends in a long-side direction, beam parts 102a1, 102a2 that extend in a short-side direction and connect a pair of long-side side walls 100a1, 100a2 to each other. However, unlike the beam member 34, the beam member 102 does not include coupling parts that extend in the long-side direction and connect the beam parts 102a1, 102a2 to each other. As in this example, the "beam member" according to the present disclosure need not necessarily include the coupling parts.

Unlike the case main body 24 that includes the intermediate opening 40 as a through-hole formed at the center of the beam member 34, the case main body 100 includes an intermediate opening 104 that is formed so as to partially adjoin the beam member 102 (to be exact, edges of the beam member 102).

The case main body 110 shown in FIG. 9B includes a beam member 112. The beam member 112 is formed only on the side of a short-side side wall 110b1 of a pair of short-side side walls 110b1, 110b2, extends in a short-side direction, and connects a pair of long-side side walls 110a1, 110a2 to each other. More specifically, the beam member 112 is entirely in contact, and integrally formed, with the short-side side wall 110b1. As in this example, the "beam member" according to the present disclosure may be provided only on the side of one of the pair of short-side side walls. More specifically, the "beam member" may be entirely in contact, and integrally formed, with only one of the pair of short-side side walls. Also in this example, an intermediate opening 114 is formed so as to partially adjoin the beam member 112 (to be exact, an edge of the beam member 112).

Other Examples of Layout of Components of PCU

The layout of the components of the PCU inside the "case main body" according to the present disclosure may be reverse to that of the above-described examples in the up-down direction. Specifically, in the example shown in FIG. 5A, the substrate 50 is disposed in the upper chamber 36 and the power module 52 and the capacitor 54 are disposed under the substrate 50 in this order. In reverse to this example, the substrate 50 may be disposed in the lower chamber 38 and the power module 52 and the capacitor 54 may be disposed above the substrate 50 in this order. The same applies to the example shown in FIG. 8.

Instead of the example of the power module 52 (see FIG. 5A) and the example of the substrate 50 (see FIG. 8), two or more components of the PCU may be supported by the "beam member." Further, two or more components of the PCU may be disposed "so as to extend to both the upper chamber and the lower chamber across the intermediate opening."

Instead of the example of the combination of the power module 52 and the capacitor 54 (see FIG. 5A) and the example of the combination of the substrate 50 and the power module 52 (see FIG. 8), three or more components of the PCU may be "electrically connected to each other through the intermediate opening while being disposed in the upper chamber and the lower chamber."

Other Examples of Basic Form of Case Main Body

The "tubular shape with a rectangular cross-section" in relation to the "case main body" according to the present disclosure is not necessarily limited to an exact rectangular cross-section and may also be a substantially rectangular cross-section. The case main body is not necessarily limited to the one formed in a straight tubular shape as in the example shown in FIG. 2, and may also be formed in, for example, a stepped tubular shape.

The examples described in the embodiments and the other modified examples described above may be appropriately combined as far as possible in other ways than the combinations indicated herein, or may be changed in various ways within the scope of the gist of the present disclosure.

What is claimed is:

1. A power control unit mounted in an electric vehicle driven by a vehicle driving unit that includes a transaxle case housing at least either a rotating electrical machine or gears, wherein:

the power control unit comprising
a plurality of components that composes the power control unit, and
a PCU case that is disposed on a surface of the transaxle case and houses the components;
the PCU case includes
a case main body having a tubular shape with a rectangular cross-section and including a pair of long-side side walls and a pair of short-side side walls that constitute side surfaces of the PCU case, an upper surface-side opening and a lower surface-side opening that are formed on sides of an upper surface and a lower surface, respectively, of the PCU case, and a fastening part that is formed so as to surround the lower surface-side opening and fastened to the surface of the transaxle case, and an upper cover that constitutes the upper surface of the PCU case and covers the upper surface-side opening;

the surface of the transaxle case doubles as the lower surface of the PCU case;

the case main body further includes a beam member that extends inside the case main body along a short-side direction of the case main body, connects the pair of long-side side walls to each other, and is formed in a plate shape so as to divide an inside of the case main body into an upper chamber and a lower chamber located on the upper surface side and the lower surface side, respectively, of the PCU case, and an intermediate opening that is formed so as to at least partially adjoin the beam member and provides communication between the upper chamber and the lower chamber;

at least one of the components is supported by the beam member; and at least two of the components are electrically connected to each other through the intermediate opening while being disposed in the upper chamber and the lower chamber.

2. The power control unit according to claim 1, wherein, when the case main body is seen from a side of the upper cover, a plurality of fastening points provided at each of portions of the fastening part that are located along the pair of long-side side walls are spaced at irregular intervals.

3. The power control unit according to claim 1, wherein at least one of the components is disposed so as to extend to both the upper chamber and the lower chamber across the intermediate opening.

4. The power control unit according to claim 3, wherein the components that are disposed so as to extend to both the upper chamber and the lower chamber across the intermediate opening include a power semiconductor module having a plurality of semiconductor switching elements.

5. The power control unit according to claim 1, wherein the components that are electrically connected to each other through the intermediate opening while being disposed in the upper chamber and the lower chamber include a combination of a capacitor and a power semiconductor module having a plurality of semiconductor switching elements.

6. The power control unit according to claim 1, wherein the components that are electrically connected to each other through the intermediate opening while being disposed in the upper chamber and the lower chamber include a combination of a substrate and a power semiconductor module having a plurality of semiconductor switching elements.

7. The power control unit according to claim 1, wherein the beam member is entirely in contact, and integrally formed, with at least one of the pair of short-side side walls.

8. The power control unit according to claim 1, wherein the beam member is entirely in contact, and integrally formed, with each of the pair of long-side side walls and the pair of short-side side walls.

9. The power control unit according to claim 1, wherein the fastening part is directly fastened to the surface of the transaxle case through a fastener.

* * * * *